United States Patent
Lu et al.

(10) Patent No.: US 7,445,953 B2
(45) Date of Patent: *Nov. 4, 2008

(54) LOW TEMPERATURE CURABLE MATERIALS FOR OPTICAL APPLICATIONS

(75) Inventors: Victor Lu, Santa Cruz, CA (US); Lei Jin, San Jose, CA (US); Arlene J. Suedmeyer, San Jose, CA (US); Paul G. Apen, San Jose, CA (US); Peter Alfred Smith, Long Valley, NJ (US); JingHong Chen, Santa Clara, CA (US)

(73) Assignee: Honeywell International Inc., Morristown, NJ (US)

( * ) Notice: Subject to any disclaimer, the term of this patent is extended or adjusted under 35 U.S.C. 154(b) by 360 days.

This patent is subject to a terminal disclaimer.

(21) Appl. No.: 11/192,352

(22) Filed: Jul. 29, 2005

(65) Prior Publication Data
US 2006/0035419 A1 Feb. 16, 2006

Related U.S. Application Data

(63) Continuation-in-part of application No. 10/910,673, filed on Aug. 3, 2004, now Pat. No. 7,015,061.

(51) Int. Cl.
*H01L 21/22* (2006.01)

(52) U.S. Cl. .................. 438/82; 438/149; 438/780; 438/781; 257/E21.261; 257/E21.264; 257/E21.271

(58) Field of Classification Search .................. 438/82, 438/149, 424, 780, 781; 427/255.18, 255.27
See application file for complete search history.

(56) References Cited

U.S. PATENT DOCUMENTS

| 4,413,088 | A | 11/1983 | Frye | 524/714 |
|---|---|---|---|---|
| 6,147,407 | A | 11/2000 | Jin et al. | 257/758 |
| 6,448,331 | B1 * | 9/2002 | Ioka et al. | 524/859 |
| 6,674,106 | B2 | 1/2004 | Tanaka et al. | 257/222 |
| 6,891,237 | B1 | 5/2005 | Bao et al. | 257/410 |
| 7,015,061 | B2 * | 3/2006 | Lu et al. | 438/82 |
| 2002/0169269 | A1 | 11/2002 | Hwang et al. | 528/10 |
| 2003/0193624 | A1 | 10/2003 | Kobayashi et al. | 349/42 |
| 2005/0106376 | A1 * | 5/2005 | Leung et al. | 428/304.4 |
| 2005/0136687 | A1 | 6/2005 | Lu et al. | 438/781 |
| 2006/0027803 | A1 | 2/2006 | Lu et al. | 257/59 |

FOREIGN PATENT DOCUMENTS

| EP | 0 327 311 | 8/1989 |
|---|---|---|
| EP | 1 046 689 | 10/2000 |
| EP | 1 296 365 | 3/2003 |
| EP | 1 376 671 | 1/2004 |
| EP | 1674904 | 6/2006 |
| JP | 03257027 | 11/1991 |
| WO | WO 03/088343 | 10/2003 |
| WO | WO 03/088344 | 10/2003 |
| WO | WO2005/037907 | 4/2005 |

* cited by examiner

*Primary Examiner*—Alexander G Ghyka
(74) *Attorney, Agent, or Firm*—Roberts & Roberts, LLP (57) ABSTRACT

The invention relates to low temperature curable spin-on glass materials which are useful for electronic applications, such as optical devices. A substantially crack-free and substantially void-free silicon polymer film is produced by (a) preparing a composition comprising at least one silicon containing pre-polymer, a catalyst, and optionally water; (b) coating a substrate with the composition to form a film on the substrate, (c) crosslinking the composition by heating to produce a substantially crack-free and substantially void-free silicon polymer film, having a a transparency to light in the range of about 400 nm to about 800 nm of about 95% or more.

39 Claims, 1 Drawing Sheet

LOW TEMPERATURE CURABLE MATERIALS FOR OPTICAL APPLICATIONS

CROSS REFERENCE TO RELATED APPLICATION

This application is a continuation in part of U.S. patent application Ser. No. 10/910,673 filed Aug. 3, 2004, now U.S. Pat. No. 7,015,061 which is incorporated herein by reference.

BACKGROUND OF THE INVENTION

1. Field of the Invention

The present invention relates to low temperature curable spin-on glass materials which are useful for electronic applications. More particularly, the invention pertains to low temperature curable spin-on glass materials which are useful for optical device fabrication.

2. Description of the Related Art

In the electronic component manufacturing industry, there is a continuing need for spin-on dielectric materials which are curable at low temperatures, i.e. at about 600° C. or less, and preferably about 250° C. or less.

The production of display devices such as electrooptic elements, thin film transistors, and display devices is known from U.S. Pat. No. 6,674,106, which is incorporated herein by reference. The fabrication of such components often requires the deposition of light transmissive dielectric materials used as planarization layers, gate dielectrics, passivation layers or interlayer dielectrics, onto features present on substrates in order to achieve proper isolation between devices. Each feature is separated by the insulating layer filled between them. These planarization layers and passivation layers need to fill spaces between narrow features without cracking and creating voids. In the manufacture of optical devices such as flat panel displays, these gate dielectrics, planarization layers and passivation layers may need to have a field breakdown voltage of about 2.5 MV/cm or more and a transparency to light in the range of about 400 nm to about 800 nm of about 95% or more. While such has been attainable with spin-on glass compositions which are cured at relatively high temperatures, layers having these properties has not been heretofore achieved with spin-on glass compositions which are cured at relatively low temperatures, i.e. at a temperature of about 600° C. or less, and preferably about 250° C. or less.

Silicon-based dielectric films such as silicate, silazane, silisequioxane or siloxane generally exhibit good gap-fill properties. The silicon-based dielectric films are formed by applying a silicon-containing pre-polymer onto a substrate followed by crosslinking. Historically, silicon-based dielectric films exhibit stability in film thickness, crosslinking density and other enhanced film properties, such as, minimum moisture absorption, high field breakdown voltage, low current leakage and resistance to organic solvent/chemicals after high temperature cures. In optical applications, organic materials that are being used as a part of the device are often unstable at higher temperature. Thus, there exists a need in the art for dielectric spin-on materials that provide crack-free and void-free gap-fill of narrow features at low process temperatures. It may also be useful for such materials to have adequate mechanical strength to withstand chemical mechanical polishing and have enhanced wet etch resistance. Films can be achieved at low temperatures by using a condensation/cross-linking catalyst including ammonium compounds, amines, phosphonium compounds and phosphine compounds. Through the use of a catalyst one can effectively lower the condensation temperature and/or drive the extent of crosslinking of silanol groups. A balance between the amount of organic content, density of the film and mechanical strength has to be maintained. Silicon-based dielectric films having a field break down values (FBD), preferably ranging from about 2.5 MV/cm or above, can be produced by the methods of the invention. Typically, silicon-based dielectric films, including silica dielectric films, are prepared from a composition comprising a suitable silicon containing pre-polymer and a catalyst, such as a metal-ion-free catalyst and one or more optional solvents and/or other components may also be included. The dielectric precursor composition is applied to a substrate suitable, e.g., for production of a semiconductor device, such as an integrated circuit ("IC") or optics, by any art-known method to form a film. The composition is then crosslinked, such as by heating to produce a gelled film. The gelled film is then heated to produce a stable film.

The films produced by the processes of the invention have a number of advantages over those previously known to the art, including improved field break down strength, that enables the produced film to be used in the optics. The property of a stable dielectric constant is advantageously achieved without the need for further surface modification steps to render the film surface hydrophobic, as was formerly required by a number of processes for forming silica dielectric films. Instead, silicon-based dielectric films as produced by the processes of the invention are sufficiently hydrophobic as initially formed.

SUMMARY OF THE INVENTION

The invention provides a method of producing a silicon-based dielectric film comprising:

(a) preparing a composition comprising at least one silicon containing pre-polymer having at least one organic group, a catalyst, and optionally water;

(b) coating a substrate with the composition to form a film on the substrate, (c) crosslinking the composition to produce a silicon-based dielectric film containing a silicon-based dielectric polymer, having a transparency to light in the range of about 400 nm to about 800 nm of about 95% or more.

The invention also provides a silicon-based dielectric film containing a silicon-based dielectric polymer, which silicon-based dielectric polymer and a transparency to light in the range of about 400 nm to about 800 nm of about 95% or more.

The invention also provides a method of producing a silicon-based dielectric film comprising:

(a) preparing a composition comprising at least one silicon containing pre-polymer having at least one organic group, a catalyst, and optionally water;

(b) coating a substrate with the composition to form a film on the substrate, (c) crosslinking the composition to produce a silicon-based dielectric film containing a silicon-based dielectric polymer, having a transparency to light in the range of about 400 nm to about 800 nm of about 95% or more; and (d) curing the silicon-based dielectric film.

The invention further provides a thin film transistor or display device comprising such a silicon-based dielectric film.

DETAILED DESCRIPTION OF THE PREFERRED EMBODIMENT

Figure 1:
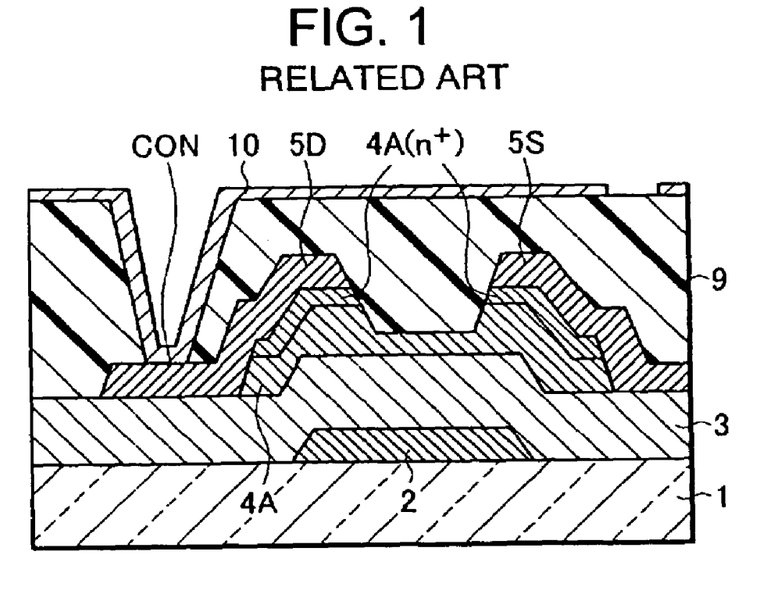
FIG. 1 is a schematic partial sectional view showing a partial section of an example of a conventional active matrix type liquid crystal display device.

As shown in FIG. 1, a metal gate electrode 2 is formed on a base plate (substrate) 1 made of glass or the like. A gate insulation film 3 is formed so as to cover the gate electrode 2. On the gate insulation film 3, a semiconductor thin film 4A is formed, which operates as an active layer of a thin film transistor. On one end side of the semiconductor thin film 4A, a drain electrode 5D is formed with a semiconductor thin film 4A(n+), which has a high impurity concentration and is made to have low resistance, inserted between the drain electrode 5D and the semiconductor thin film 4A. On the other end side of the amorphous (non-crystalline)semiconductor thin film 4A, a source electrode 5S is formed with another amorphous semiconductor thin film 4A(n+), which is also made to have low resistance, inserted between the source electrode 5S and the amorphous semiconductor thin film 4A. A leveling film 9 is formed so as to cover the drain electrode 5D and the source electrode 5S. On the leveling film 9, a pixel electrode 10 which comprises a transparent conductive film such as a film including indium tin oxide as its main ingredient is formed to connect electrically with the drain electrode 5D through a contact hole CON.

Figure 2:
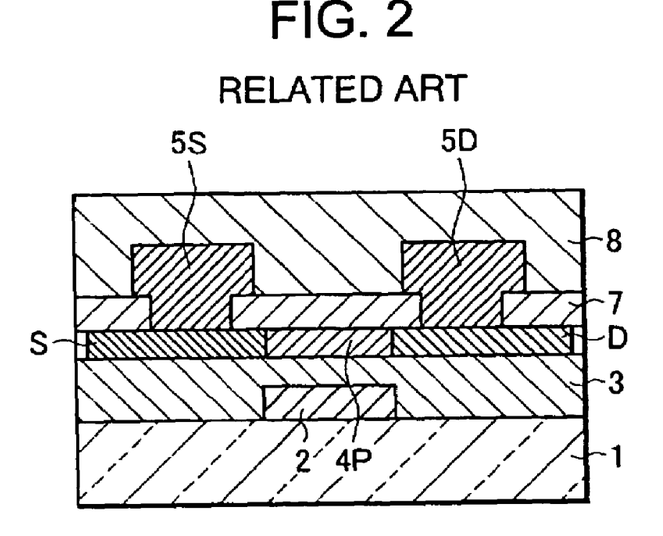
FIG. 2 shows another type of conventional display device.

As shown in FIG. 2, a gate electrode 2 is formed on a glass base plate 1. A gate insulation film 3 is formed so as to cover the gate electrode 2. A polycrystalline semiconductor thin film 4P is formed above the gate electrode 2 with a gate insulation film 3 inserted between the polycrystalline semiconductor thin film 4P and the gate electrode 2. A part of the polycrystalline semiconductor thin film 4P placed right above the gate electrode 2 is formed as a channel region, and parts on both sides of the channel region are formed as a source region S and a drain region D locations, where impurities are injected in a high concentration. The semiconductor thin film 4P is covered with an interlayer insulation film 7 and spaces where insulation film 7 has been previously patterned and etched away, and a drain electrode 5D and a source electrode 5S are formed on the interlayer insulation film 7. These electrodes 5D and 5S are covered with a protection film 8. The film of the present invention may be used, for example, as the gate insulation film 3, interlayer insulation film 7, protection film 8 or leveling film 9 in these structures.

Silicon-based dielectric films are prepared from a composition comprising a suitable silicon containing pre-polymer, blended with a catalyst, which may be a metal containing catalyst, a metal-ion-free catalyst or a nucleophile, and optionally water. One or more optional solvents and/or other components may also be included. The dielectric precursor composition is applied to a suitable substrate, e.g., for production of a device such as a semiconductor device, an integrated circuit ("IC"), a display device, a thin film transistor or the like, by any art-known method to form a film. The composition is then crosslinked to produce a silica dielectric film. Preferably the composition is absent any porogen, i.e., a component which generates pores in the film.

The films produced by the processes of the invention have a number of advantages over those previously known to the art, including curability by heating at a temperature of about 600° C. or less, having a preferred field breakdown voltage of about 2.5 MV/cm or more and a transparency to light in the range of about 400 nm to about 800 nm of about 95% or more. Preferably the film is substantially crack-free, substantially void free, gap-fill, and withstands the further processing steps required to prepare an electronic device.

Silicon-based dielectric films are prepared from suitable compositions applied to substrates in the fabrication of electronic devices. Art-known methods for applying the dielectric precursor composition, include, but are not limited to, spin-coating, dip coating, brushing, rolling, and/or spraying. Prior to application of the base materials to form the dielectric film, the substrate surface is optionally prepared for coating by standard, art-known cleaning methods. The coating is then applied and processed to achieve the desired type and consistency of dielectric coating, wherein the processing steps are selected to be appropriate for the selected precursor and the desired final product. Further details of the inventive methods and compositions are provided below.

A "substrate" as used herein includes any suitable composition formed before a silica film of the invention is applied to and/or formed on that composition. For example, a substrate may be a silicon wafer suitable for producing an integrated circuit, and the silicon-based dielectric material from which the silica film is formed is applied onto the substrate by conventional methods. Suitable substrates for the present invention non-exclusively include films, glass, ceramic, plastic, composite materials, silicon and compositions containing silicon such as crystalline silicon, polysilicon, amorphous silicon, epitaxial silicon, silicon dioxide ("$SiO_2$"), silicon nitride, silicon oxide, silicon oxycarbide, silicon carbide, silicon oxynitride, organosiloxanes, organosilicon glass, fluorinated silicon glass, and semiconductor materials such as gallium arsenide ("GaAs"), and mixtures thereof. In other embodiments, the substrate comprise a material or materials common in the packaging and circuit board industries such as silicon, glass, and polymers. A circuit board made of the present composition may have surface patterns for various electrical conductor circuits n its surface. The circuit board may include various reinforcements, such as woven non-conducting fibers or glass cloth. Such circuit boards may be single sided, as well as double sided.

On the surface of the substrate is an optional pattern of raised lines, such as oxide, nitride or oxynitride lines which are formed by well known lithographic techniques. Suitable materials for the lines include silicon oxide, silicon nitride, and silicon oxynitride. Other optional features of the surface of a suitable substrate include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane oxide ("PETEOS"), plasma enhanced silane oxide ("PE silane") and combinations thereof, as well as one or more previously formed silica dielectric films.

The silicon-based dielectric films of the invention can be applied so as to cover and/or lie between optional electronic surface features, e.g., circuit elements and/or conduction pathways that may have been previously formed features of the substrate. Such optional substrate features can also be applied above the silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a silicon-based dielectric film of the invention, during the manufacture of a multilayer and/or multicomponent integrated circuit. In a further option, a substrate bearing a silicon-based dielectric film or films according to the invention can be further covered with any art known non-porous insulation layer, e.g., a glass cap layer.

It should be understood that within the context of this invention, the term gelling refers to condensing, or polymerization, of the combined silica-based precursor composition on the substrate after deposition. The crosslinkable composition employed for forming silica dielectric films according to the invention includes one or more silicon-containing prepolymers that are readily condensed. It should have at least two reactive groups that can be hydrolyzed. Such reactive groups include, alkoxy (RO), acetoxy (AcO), etc. Without being bound by any theory or hypothesis as to how the methods and compositions of the invention are achieved, it is believed that water hydrolyzes the reactive groups on the silicon monomers to form Si—OH groups (silanols). The latter will undergo condensation reactions with other silanols or with other reactive groups, as illustrated by the following formulas:

Si—OH+HO—Si→Si—O—Si+H$_2$O

Si—OH+RO—Si→Si—O—Si+ROH

Si—OH+AcO—Si→Si—O—Si+AcOH

Si—OAc+AcO—Si→Si—O—Si+Ac$_2$O

R=alkyl or aryl

Ac=acyl (CH$_3$CO)

These condensation reactions lead to formation of silicon containing polymers. In one embodiment of the invention, the prepolymer includes a compound, or any combination of compounds, denoted by Formula I:

Rx-Si-Ly    (Formula I)

wherein x is an integer ranging from 0 to about 2 and y is 4-x, an integer ranging from about 2 to about 4), R is independently alkyl, aryl, hydrogen, alkylene, arylene, and/or combinations of these, L is independently selected and is an electronegative group, e.g., alkoxy, carboxyl, amino, amido, halide, isocyanato and/or combinations of these.

Particularly useful prepolymers are those provided by Formula I when x ranges from about 0 to about 2, y ranges from about 2 to about 4, R is alkyl or aryl or H, and L is an electronegative group, and wherein the rate of hydrolysis of the Si-L bond is greater than the rate of hydrolysis of the Si—OCH$_2$CH$_3$ bond. Thus, for the following reactions designated as (a) and (b):

Si-L+H$_2$O→Si—OH+HL    (a)

Si—OCH$_2$CH$_3$+H$_2$O→Si—OH+HOCH$_2$CH$_3$    (b)

The rate of (a) is greater than rate of (b).

Examples of suitable compounds according to Formula I include, but are not limited to:

| | |
|---|---|
| Si(OCH$_2$CF$_3$)$_4$ | tetrakis(2,2,2-trifluoroethoxy)silane, |
| Si(OCOCF$_3$)$_4$ | tetrakis(trifluoroacetoxy)silane*, |
| Si(OCN)$_4$ | tetraisocyanatosilane, |
| CH$_3$Si(OCH$_2$CF$_3$)$_3$ | tris(2,2,2-trifluoroethoxy)methylsilane, |
| CH$_3$Si(OCOCF$_3$)$_3$ | tris(trifluoroacetoxy)methylsilane*, |
| CH$_3$Si(OCN)$_3$ | methyltriisocyanatosilane, |

[*These generate an acid catalyst upon exposure to water] and or combinations of any of the above.

In another embodiment of the invention, the composition includes a polymer synthesized from compounds denoted by Formula I by way of hydrolysis and condensation reactions, wherein the number average molecular weight ranges from about 150 to about 300,000 amu, or more typically from about 150 to about 10,000 amu.

In a further embodiment of the invention, silicon-containing prepolymers useful according to the invention include organosilanes, including, for example, alkoxysilanes according to Formula II:

Formula II

Optionally, Formula II is an alkoxysilane wherein at least 2 of the R groups are independently C$_1$ to C$_4$ alkoxy groups, and the balance, if any, are independently selected from the group consisting of hydrogen, alkyl, phenyl, halogen, substituted phenyl, substituted alkyl, substituted aryl. For purposes of this invention, the term alkoxy includes any other organic groups which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

In a further option, for instance, the prepolymer can also be an alkylalkoxysilane as described by Formula II, but instead, at least 2 of the R groups are independently C$_1$ to C$_4$ alkylalkoxy groups wherein the alkyl moiety is C$_1$ to C$_4$ alkyl and the alkoxy moiety is C$_1$ to C$_6$ alkoxy, or ether-alkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is C$_1$ to C$_4$ alkyl and the alkoxy moiety is C$_1$ to C$_6$ alkoxy. In yet another preferred embodiment for a vapor phase precursor, at least two R groups are ether-alkoxy groups of the formula (C$_1$ to C$_6$ alkoxy)$_n$ wherein n is 2 to 6.

Useful silicon-containing prepolymers include, for example, any or a combination of alkoxysilanes such as tetraethoxysilane, tetrapropoxysilane, tetraisopropoxysilane, tetra(methoxyethoxy)silane, tetra(methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy)silane, tetrakis(2-ethylthoxy)silane, tetrakis(methoxyethoxy)silane, and tetrakis(methoxypropoxy)silane are particularly useful for the invention.

In a still further embodiment of the invention, the alkoxysilane compounds described above may be replaced, in whole or in part, by compounds with acetoxy and/or halogen-based leaving groups. For example, the prepolymer may be an acetoxy (CH$_3$—CO—O—) such as an acetoxysilane compound and/or a halogenated compound, e.g., a halogenated silane compound and/or combinations thereof. For the halogenated prepolymers the halogen is, e.g., Cl, Br, I and in certain aspects, will optionally include F. Preferred acetoxy-derived prepolymers include, e.g., tetraacetoxysilane, methyltriacetoxysilane and/or combinations thereof.

In one particular embodiment of the invention, the silicon containing prepolymer includes a monomer or polymer precursor, for example, acetoxysilane, an ethoxysilane, methoxysilane and/or combinations thereof.

In a more particular embodiment of the invention, the silicon containing prepolymer includes a tetraacetoxysilane, a $C_1$ to about $C_6$ alkyl or aryl-triacetoxysilane and combinations thereof. In particular, as exemplified below, the triacetoxysilane is a methyltriacetoxysilane.

In one embodiment of the invention the silicon containing prepolymer is present in the overall composition in an amount of from about 10 weight percent to about 80 weight percent, in another embodiment from about 20 weight percent to about 60 weight percent.

For non-microelectronic applications, the onium or nucleophile catalyst may contain metal ions. Examples include sodium hydroxide, sodium sulfate, potassium hydroxide, lithium hydroxide, and zirconium containing catalysts.

For microelectronic applications, the composition then contains at least one metal-ion-free catalyst which may be, for example an onium compound or a nucleophile. For purposes of this invention, metal ion free means substantially free of metal ions, although not necessarily completely free on metal ions, the catalyst may be, for example an ammonium compound, an amine, a phosphonium compound or a phosphine compound. Non-exclusive examples of such include tetraorganoammonium compounds and tetraorganophosphonium compounds including tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof.

The composition may comprise a non-metallic, nucleophilic additive which accelerates the crosslinking of the composition. These include dimethyl sulfone, dimethyl formamide, hexamethylphosphorous triamide (HMPT), amines and combinations thereof. The catalyst is usually present in the overall composition in an amount of from about 1 ppm by weight to about 1000 ppm, and more usually present in the overall composition in an amount of from about 6 ppm to about 200 ppm.

The overall composition then optionally includes a solvent composition. Reference herein to a "solvent" should be understood to encompass a single solvent, polar or nonpolar and/or a combination of compatible solvents forming a solvent system selected to solubilize the overall composition components. A solvent is optionally included in the composition to lower its viscosity and promote uniform coating onto a substrate by art-standard methods.

In order to facilitate solvent removal, the solvent is one which has a relatively low boiling point relative to the boiling point of the precursor components. For example, solvents that are useful for the processes of the invention have a boiling point ranging from about 50° C. to about 250° C. to allow the solvent to evaporate from the applied film and leave the active portion of the precursor composition in place. In order to meet various safety and environmental requirements, the solvent preferably has a high flash point (generally greater than 40° C.) and relatively low levels of toxicity. A suitable solvent includes, for example, hydrocarbons, as well as solvents having the functional groups C—O—C (ethers), —CO—O (esters), —CO— (ketones), —OH (alcohols), and —CO—N- (amides), and solvents which contain a plurality of these functional groups, and combinations thereof.

Suitable solvents for use in such solutions of the present compositions include any suitable single or mixture of organic, organometallic, or inorganic molecules that are volatized at a desired temperature. Suitable solvents non-exclusively include aprotic solvents, for example, cyclic ketones such as cyclopentanone, cyclohexanone, cycloheptanone, and cyclooctanone; cyclic amides such as N-alkylpyrrolidinone wherein the alkyl has from about 1 to 4 carbon atoms; and N-cyclohexylpyrrolidinone and mixtures thereof. A wide variety of other organic solvents may be used herein insofar as they are able to aid dissolution of the adhesion promoter and at the same time effectively control the viscosity of the resulting solution as a coating solution. Various facilitating measures such as stirring and/or heating may be used to aid in the dissolution. Other suitable solvents include methyethylketone, methylisobutylketone, dibutyl ether, cyclic dimethylpolysiloxanes, butyrolactone, γ-butyrolactone, 2-heptanone, ethyl 3-ethoxypropionate, 1-methyl-2-pyrrolidinone, and propylene glycol methyl ether acetate (PGMEA), and hydrocarbon solvents such as mesitylene, xylenes, benzene, toluene di-n-butyl ether, anisole, acetone, 3-pentanone, 2-heptanone, ethyl acetate, n-propyl acetate, n-butyl acetate, ethyl lactate, ethanol, 2-propanol, dimethyl acetamide, propylene glycol methyl ether acetate, and/or combinations thereof. It is better that the solvent does not react with the silicon containing prepolymer component.

The solvent component may be present in an amount of from about 10% to about 95% by weight of the overall composition. A more usual range is from about 20% to about 75% and most usually from about 20% to about 60%. The greater the percentage of solvent employed, the thinner is the resulting film.

In another embodiment of the invention the composition may comprise water, either liquid water or water vapor. For example, the overall composition may be applied to a substrate and then exposed to an ambient atmosphere that includes water vapor at standard temperatures and standard atmospheric pressure. Optionally, the composition is prepared prior to application to a substrate to include water in a proportion suitable for initiating aging of the precursor composition, without being present in a proportion that results in the precursor composition aging or gelling before it can be applied to a desired substrate. By way of example, when water is mixed into the precursor composition it is present in a proportion wherein the composition comprises water in a molar ratio of water to Si atoms in the silicon containing prepolymer ranging from about 0.1:1 to about 50:1. In another embodiment, it ranges from about 0.1:1 to about 10:1 and in still another embodiment from about 0.5:1 to about 1.5:1.

The overall composition may also comprise additional components such as adhesion promoters, antifoam agents, detergents, flame retardants, pigments, plasticizers, stabilizers, and surfactants. The composition also has utility in non-microelectronic applications such as thermal insulation, encapsulant, matrix materials for polymer and ceramic composites, light weight composites, acoustic insulation, anti-corrosive coatings, binders for ceramic powders, and fire retardant coatings. In another embodiment of the invention, the composition further comprises phosphorous and/or boron doping. Typically, the optional phosphorous and/or boron is present in an amount ranging from 10 parts per million to 10% by weight of the composition.

Those skilled in the art will appreciate that specific conditions for crosslinking from the dielectric films will depend on the selected materials, substrate and desired structure, as is readily determined by routine manipulation of these parameters. Generally, the coated substrate is subjected to a treatment such as heating, UV or e-beam to effect crosslinking of the composition on the substrate to produce a substantially crack-free, and substantially void-free silicon-based dielectric film. The silicon-based dielectric polymer and film may have a SiC:SiO bond ratio of about 0.01 or more, preferably about 0.02 or more, more preferably about 0.05 or more, and still more preferably about 0.15 or more. In another embodiment, the silicon polymer film has a weight ratio of organic groups to SiO groups of about 0.15 to about 0.30. In another embodiment the ratio is from about 0.02 to about 0.065 as measured by Fourier Transform Infrared (FTIR) spectroscopy area integration.

In one embodiment, the film preferably has a dielectric constant of about 4.0 or less. In another embodiment the film has a field breakdown voltage of about 2.5 MV/cm or more. Preferably the film has a wet etch resistance in a 100:1 by volume mixture of water and hydrogen fluoride of about 30 Å/minute or less. The film preferably has a transparency to light in the range of about 400 nm to about 800 nm of about 95% or more, usually about 99% or more. In one embodiment the silica dielectric film has a transparency to light in the range of about 400 nm to about 800 nm of about 100%. In one embodiment, crosslinking this may be done by heating at a temperature of about 600° C. or less. In another embodiment, the crosslinking is conducted by heating the composition at a temperature of about 250° C. or less. In another embodiment, heating is conducted at a temperature of from about 200° C. or less. In another embodiment the crosslinking is conducted by heating the composition at a temperature of from about 125° C. to about 500° C. In another embodiment the crosslinking is conducted by heating the composition at a temperature of from about 125° C. to about 250° C. In another embodiment the crosslinking is conducted by heating the composition at a temperature of from about 150° C. to about 425° C. In another embodiment the crosslinking is conducted by heating the composition at a temperature of from about 225° C. to about 250° C. In another embodiment useful temperatures range from about 150° C. to about 250° C., in another embodiment the useful temperatures range from about 160° C. to about 240° C., and in still another embodiment, the useful temperatures range from about 180° C. to about 200° C.

In one embodiment the crosinkling this may be done by heating for about 120 minutes or less. In another embodiment, the heating may be conducted for about 90 minutes or less. In another embodiment, the heating may be conducted for about 60 minutes or less. In another embodiment, the heating may be conducted for about 30 minutes or less. In another embodiment, the heating may be conducted for from about 1 minute to about 30 minutes. In another embodiment it may be for a time period ranging from about 5 minutes to about 20 minutes and in still another embodiment from about 10 minutes to about 15 minutes.

In another embodiment of the invention, the film may be subjected to a curing treatment. Such may be done by the application of heat, ultraviolet radiation, or combinations of heating and ultraviolet radiation. The use of ultraviolet radiation lowers the temperature and total amount of heat applied to achieve a cured film. A heat curing may be done by baking at about 250° C. or less, preferably from 125° C. to about 500° C. for from about 10 minutes to about 120 minutes, preferably about 10 minutes to about 60 minutes. An ultraviolet curing may be done by exposure to a broad or narrow spectrum of wavelengths in the range of about 100 nm to about 400 nm, preferably from about 172 nm to about 250 nm. A typical ultraviolet radiation exposure dose is from about 100 mJ/cm$^2$ to about 200 mJ/cm$^2$. When a combination of heating and ultraviolet radiation are used for curing, the temperature may typically be from about 125° C. to about 500° C., preferably about 250° C. or less, and usually from about 125° C. to about 250° C.

The composition may be used in electrical devices and more specifically, as an interlayer dielectric in an interconnect associated with a single integrated circuit ("IC") chip. An integrated circuit chip typically has on its surface a plurality of layers of the present composition and multiple layers of metal conductors. It may also include regions of the present composition between discrete metal conductors or regions of conductor in the same layer or level of an integrated circuit.

The films have excellent wet etch resistance having a wet etch removal rate of from about 10 angstroms/minute or less and in another embodiment the wet etch removal rate is from about 0 angstroms/minute to about 8 angstroms/minute and in still another embodiment from about 1 angstroms/minute to about 7 angstroms/minute when immersed in a solvent (i.e., N-methyl pyrrolidone, propylene glycol methyl ether acetate, isopropyl alcohol, ethyl lactate, 2.4% TMAH). Usually such a test is conducted for a period of about 10 minutes. The films have a preferred, but not required field breakdown voltage of about 2.5 MV/cm or more in one embodiment. In another embodiment, it is about 3 MV/cm or more, and in still another embodiment from about 3.5 MV/cm to about 5 MV/cm.

The following non-limiting examples serve to illustrate the invention.

EXAMPLES

Analytical Test Methods:

Refractive Index (RI): The refractive index measurements were performed together with the thickness measurements using a J. A. Woollam M-88 spectroscopic ellipsometer. A Cauchy model was used to calculate the best fit for Psi and Delta. Unless noted otherwise, the refractive index was reported at a wavelength of 633 nm (details on Ellipsometry can be found in e.g. "Spectroscopic Ellipsometry and Reflectometry" by H. G. Thompkins and William A. McGahan, John Wiley and Sons, Inc., 1999), which is incorporated herein by reference.

Field Breakdown Voltage: IV (leakage current vs voltage) measurements are performed to determine the breakdown field ($F_{BD}$, unit MV/cm). The breakdown field is the electric field at a leakage current of 1e-6 A. The IV measurements for thin films are done on the SSM5100 (Hg probe) instrument. Each IV measurement is a destructive test; it can not use the same site again for another measurement (CV (capacitance vs voltage) or IV). Breakdown voltage ($V_{BD}$) is measured using stepped voltage scan on SSM5100 (Hg probe) and, breakdown field ($F_{BD}$) is calculated using the $V_{BD}$ and film thickness (see equation 1). Breakdown current is defined at 1.0E-06A ($V_{BD}$ is determined at this current value). Standard breakdown measurement is 25-point pattern per wafer. The maximum (last) voltage is set relative to film thickness. Field break down is calculated from the following equation $$F_{BD}=V_{BD}/t \quad\quad (1) \text{ } (F_{BD} \text{ is reported in MV/cm})$$

Where:
$V_{BD}$ is breakdown voltage at 1.0 E-6A
t is film thickness in cm.

Example 1 (Comparative)

To a 22-L flask equipped with a magnetic stir bar and a nitrogen inlet-outlet were added 3111 g of tetraethoxysilane (TEOS), 335 g of dimethyldiethoxysilane (DMDEOS), 4595 g of isopropanol and 2313 g of propylene glycol methyl ether acetate (PGMEA). The mixture was stirred at room temperature for 24 hours. To this mixture (with vigorous stirring) were added a pre-mixed diluted nitric acid (159 g of 0.1 M nitric acid in 122 g of deionized water) slowly and steadily. The mixture was heated to reflux for 9 hours with vigorous stirring. The reaction mixture was then allowed to cool to room temperature and kept stirring for another 15 hours before 2558 g of 1% deionized water was added. When the solution clears, 2680 g of methyltriethoxy (MTEOS) was added. The resulting reaction mixture was stirred vigorously for 30 min before it was heated to reflux for 9 hours. The reaction mixture was then allowed to cool to room temperature and kept stirring overnight before 159 g of 10% BYK-307® (a Polyether modified poly-dimethyl-siloxane based surfactant available from BYK-Chemie GmbH) was added. The mixture was stirred at room temperature for 24 hours. The clear solution (Accuglass T12PMD™, commercially available from Honeywell International Inc., of Sunnyvale, Calif.) that obtained was filtered through 0.05 μm polyethylene filter twice and was ready for the next step. The solution is then deposited onto a series of 8-inch silicon wafers, each on a spin chuck and spun at 1000 rpm for 15 seconds. The presence of water in the precursor resulted in the film coating being substantially condensed by the time that the wafer was inserted into the first oven. Insertion into the first oven, as discussed below, takes place within the 10 seconds of the completion of spinning. Each coated wafer was then transferred into a sequential series of ovens preset at specific temperatures, for one minute each. In this example, there are two ovens, and the preset oven temperatures were 125° C., and 200° C., respectively. Each wafer is cooled after receiving the two-oven stepped heat treatment, and the produced dielectric film was measured using ellipsometry to determine its thickness and refractive index. The baked film is also heated at 200° C. for an additional 60 min to crosslinking further and to produce a substantially crack-free dielectric film for further characterizations. The break down voltage of the film was measured under ambient conditions (room temperature and humidity) using Hg probe and was determined to be at 1.77 MV/cm. (see Entry 1 of Table 1) The silicon polymer has a weight ratio of organic groups ($CH_3$) to SiO groups of about 0.16:1

Example 2

To a 3500 g solution of Accuglass T12PMD™ was added 6.65 g of Tetramethylammonium acetate (TMAA) (1% in acetic acid). The reaction mixture was stirred for 1 hour at ambient, and filtered through 0.04 μm polyethylene filter. The resulting solution is then ready for the next step. The solution is then deposited onto a series of 8-inch silicon wafers, each on a spin chuck and spun at 1000 rpm for 15 seconds. The presence of water in the precursor resulted in the film coating being substantially condensed by the time that the wafer was inserted into the first oven. Insertion into the first oven, as discussed below, takes place within the 10 seconds of the completion of spinning. Each coated wafer was then transferred into a sequential series of ovens preset at specific temperatures, for one minute each. In this example, there are two ovens, and the preset oven temperatures were 125° C., and 200° C., respectively. Each wafer is cooled after receiving the two-oven stepped heat treatment, and the produced dielectric film was measured using ellipsometry to determine its thickness and refractive index. The baked film is also heated at 200° C. for an additional 60 min to crosslinking further and to produce a substantially crack-free dielectric film for further characterizations. A small piece of the film-coated wafer is also subjected to wet etch resistance analysis. The film-coated wafer piece is immersed in a solvent (i.e., NMP, PGMEA, isopropyl alcohol, ethyl lactate, 2.4% TMAH) for a period of 10 minutes at ambient. The difference in film thickness (0 Å over 10 min) suggests the solvent resistance of the film. The break down voltage of the film was measured under ambient conditions (room temperature and humidity) using Hg probe and was determined to be at 4.93 MV/cm. (see Entry 2 of Table 1) The silicon polymer has a weight ratio of organic groups ($CH_3$) to SiO groups of about 0.16:1. Reflectivity measurement data suggest that the material is transparent in the region between 200 and 633 nm.

Example 3

This example shows the production of a silicon-containing pre-polymer. A precursor was prepared by combining 1300 g tetraacetoxysilane, 1300 g methyltriacetoxysilane, and 1400 g propylene glycol methyl ethyl acetate (PGMEA) in a 6 liter reactor containing a overhead stirrer and a jacketed water cooler. These ingredients were weighed out within an $N_2$-environment ($N_2$ glove bag). The reactor was also connected to an $N_2$ environment to prevent environmental moisture from entering the solution (standard temperature and pressure).

The reaction mixture was heated to 80° C. before 194.8 g of water was added to the flask at a rate of 16 ml/minute. After the water addition is complete, the reaction mixture was allowed to cool to ambient before 12.73 g of tetramethyl ammonium acetate (TMAA, 1% in acetic acid) was added. The resulting solution mixture was filtered through a 0.2 micron filter to provide the precursor solution for the next step. The solution is then deposited onto a series of 8-inch silicon wafers, each on a spin chuck and spun at 1000 rpm for 15 seconds. The presence of water in the precursor resulted in the film coating being substantially condensed by the time that the wafer was inserted into the first oven. Insertion into the first oven, as discussed below, takes place within the 10 seconds of the completion of spinning. Each coated wafer was then transferred into a sequential series of ovens preset at specific temperatures, for one minute each. In this example, there are two ovens, and the preset oven temperatures were 125° C., and 200° C., respectively. Each wafer is cooled after receiving the two-oven stepped heat treatment, and the produced dielectric film was measured using ellipsometry to determine its thickness and refractive index. The baked film is also heated at 200° C. for an additional 60 min to crosslinking further and to produce a substantially crack-free dielectric film for further characterizations. The break down voltage of the film was measured under ambient conditions (room temperature and humidity) using Hg probe and was determined to be at 3.77 MV/cm. (see Entry 3 of Table 1) The silicon polymer has a weight ratio of organic groups ($CH_3$) to SiO groups of about 0.15:1

TABLE 1

Film Properties of 200° C. Cured Dielectric Films

| Entry | Thickness (nm) | Refractive Index | Film Shrinkage % | FBD (MV/cm) | $CH_3$/SiO |
|---|---|---|---|---|---|
| 1 | 443 | 1.41 | 2.04 | 1.77 | 0.16 |
| 2 | 464 | 1.40 | 1.53 | 4.93 | 0.16 |
| 3 | 606 | 1.41 | 1.18 | 3.77 | 0.15 |

Example 4

To a 3500 g solution of Accuglass T12PMD™ is added 6.65 g of tetramethylammonium acetate (TMAA) (1% in acetic acid). The reaction mixture is stirred for 1 hour at ambient, and filtered through 0.04 µm polyethylene filter. The resulting solution is then deposited onto a series of 8-inch silicon wafers, each on a spin chuck and spun at 1000 rpm for 15 seconds. The presence of water in the precursor results in the film coating being substantially condensed by the time that the wafer is inserted into the first oven. Insertion into an oven, takes place within the 10 seconds of the completion of spinning. Each coated wafer is then transferred into an oven preset at a specific temperature, for one minute each. In this example, the preset oven temperature is 600° C. Each wafer is cooled after receiving the oven heat treatment, and the dielectric film is measured using ellipsometry to determine its thickness and refractive index. The baked film is also heated at 200° C. for an additional 60 minutes to crosslinking further and to produce a substantially crack-free dielectric film for further characterization. A small piece of the film-coated wafer is also subjected to wet etch resistance analysis. The film-coated wafer piece is immersed in a solvent (i.e., NMP, PGMEA, isopropyl alcohol, ethyl lactate, 2.4% TMAH) for a period of 10 minutes at ambient. The difference in film thickness suggests the solvent resistance of the film. The break down voltage of the film is measured under ambient conditions (room temperature and humidity) using Hg probe and is determined. Reflectivity measurement data suggest that the material is highly transparent in the region between 400 and 800 nm.

Example 5

Example 4 is repeated except the oven temperature is set at 600° C. Similar results may be noted.

Example 6

Example 4 is repeated except the oven temperature is set at 500° C. Similar results may be noted.

Example 7

Example 4 is repeated except the oven temperature is set at 250° C. Similar results may be noted.

Example 8

A precursor is prepared by combining 1300 g tetraacetoxysilane, 1300 g methyltriacetoxysilane, and 1400 g propylene glycol methyl ethyl acetate (PGMEA) in a 6 liter reactor containing a overhead stirrer and a jacketed water cooler. These ingredients are weighed out within an $N_2$-environment $N_2$ glove bag). The reactor is also connected to an $N_2$ environment to prevent environmental moisture from entering the solution (standard temperature and pressure). The reaction mixture is heated to 80° C. before 194.8 g of water is added to the flask at a rate of 16 ml/minute. After the water addition is complete, the reaction mixture is allowed to cool to ambient before 12.73 g of tetramethyl ammonium acetate (TMAA, 1% in acetic acid) is added. The resulting solution mixture is filtered through a 0.2 micron filter to provide the precursor solution for the next step. The solution is then deposited onto a series of 8-inch silicon wafers, each on a spin chuck and spun at 1000 rpm for 15 seconds. The presence of water in the precursor results in the film coating being substantially condensed by the time that the wafer is inserted into the an oven. Insertion into the oven, takes place within the 10 seconds of the completion of spinning. Each coated wafer is then transferred into an oven preset at a specific temperature, for one minute each. In this example, the preset oven temperature is 500° C. Each wafer is cooled after receiving the two-oven stepped heat treatment, and the produced dielectric film is measured using ellipsometry to determine its thickness and refractive index. The baked film is also heated at 200° C. for an additional 60 minutes to crosslinking further and to produce a substantially crack-free dielectric film for further characterizations. The break down voltage of the film is measured under ambient conditions (room temperature and humidity) using Hg probe.

Example 9

Example 4 is repeated except the oven temperature is set at 600° C. Similar results may be noted.

Example 9

Example 4 is repeated except the oven temperature is set at 225° C. Similar results may be noted.

Example 10

Example 4 is repeated except the oven temperature is set at 125° C. Similar results may be noted.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method of producing a silicon-based dielectric film comprising:
   (a) preparing a composition comprising at least one silicon containing pre-polymer having at least one organic group, a catalyst, and optionally water, and wherein the composition is absent of any porogen;
   (b) coating a substrate with the composition to form a film on the substrate,
   (c) crosslinking the composition for about 30 minutes or less to produce a substantially void-free silicon-based dielectric film containing a silicon-based dielectric polymer, having a transparency to light in the range of about 400 nm to about 800 nm of about 95% or more.

2. The method of claim 1 wherein step (c) is conducted by heating the composition at a temperature of about 600° C. or less.

3. The method of claim 1 wherein step (c) is conducted by heating the composition at a temperature of about 250° C. or less.

4. The method of claim 1 wherein step (c) is conducted by heating the composition at a temperature of from about 125° C. to about 250° C.

5. The method of claim 1 wherein step (c) is conducted by heating the composition at a temperature of from about 125° C. to about 500° C.

6. The method of claim 1 wherein step (c) is conducted by heating the composition at a temperature of from about 150° C. to about 425° C.

7. The method of claim 1 wherein the silicon-based dielectric polymer has a weight ratio of organic groups to SiO groups of about 0.01:1 or more.

8. The method of claim 1 wherein the silicon-based dielectric polymer has a weight ratio of organic groups to SiO groups of about 0.15:1 or more.

9. The method of claim 1 wherein the silicon-based dielectric film has a field breakdown voltage of about 2.5 MV/cm or more.

10. The method of claim 1 wherein the composition of step (a) comprises water.

11. The method of claim 1 wherein the composition of step (a) comprises a metal-ion-free catalyst selected from the group consisting of onium compounds and nucleophiles.

12. The method of claim 1 wherein the catalyst is selected from the group consisting of ammonium compounds, amines, phosphonium compounds, phosphine compounds, and combinations thereof.

13. The method of claim 1 wherein the catalyst is selected from the group consisting of tetraorganoammonium compounds, tetraorganophosphonium compounds, and combinations thereof.

14. The method of claim 1 wherein the catalyst is selected from the group consisting of tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof.

15. The method of claim 1 wherein the composition further comprises a nucleophilic additive which accelerates the crosslinking of the composition.

16. The method of claim 1 wherein the composition further comprises a nucleophilic additive which accelerates the crosslinking of the composition, which is selected from the group consisting of dimethyl sulfone, dimethyl formamide, hexamethylphosphorous triamide, amines, sodium hydroxide, potassium hydroxide, lithium hydroxide, sodium chloride, potassium chloride, lithium chloride and combinations thereof.

17. The method of claim 1 wherein the composition comprises a silicon containing pre-polymer of Formula I:

$$Rx\text{-}Si\text{-}Ly \quad \text{(Formula I)}$$

wherein x is an integer ranging from 0 to about 2, and y is x-4, an integer ranging from about 2 to about 4;
R is independently selected from the group consisting of alkyl, aryl, hydrogen, alkylene, arylene, substituted alkyl, substituted aryl, and combinations thereof;
L is an electronegative moiety, independently selected from the group consisting of alkoxy, carboxyl, acetoxy, amino, amido, halide, isocyanato and combinations thereof.

18. The method of claim 17 wherein the composition comprises a polymer formed by condensing a pre-polymer according to Formula I, wherein the number average molecular weight of said polymer ranges from about 150 to about 300,000 amu.

19. The method of claim 1 wherein the composition comprises a silicon containing pre-polymer selected from the group consisting of an acetoxysilane, an ethoxysilane, a methoxysilane, and combinations thereof.

20. The method of claim 1 wherein the composition comprises a silicon containing pre-polymer selected from the group consisting of tetraacetoxysilane, a $C_1$ to about $C_6$ alkyl or aryl-triacetoxysilane, and combinations thereof.

21. The method of claim 1 wherein the composition comprises a silicon containing pre-polymer selected from the group consisting of tetraethoxysilane, a $C_1$ to $C_6$ alkyltriethoxysilane, an aryl-triethoxysilane, a $C_1$ to $C_4$ dialkyltriethoxysilane, a diaryl-diethoxysilane, and combinations thereof.

22. The method of claim 21 wherein said triethoxysilane comprises methyltriethoxysilane.

23. The method of claim 21 wherein said diethoxysilane comprises dimethyldiethoxysilane.

24. The method of claim 20 wherein said triacetoxysilane comprises methyltriacetoxysilane.

25. The method of claim 1 wherein the composition comprises a silicon containing pre-polymer selected from the group consisting of tetrakis(2,2,2-trifluoroethoxy)silane, tetrakis(trifluoroacetoxy)silane, tetraisocyanatosilane, tris(2,2,2-trifluoroethoxy)methylsilane, tris(trifluoroacetoxy)methylsilane methyltriisocyanatosilane and combinations thereof.

26. The method of claim 1 wherein the composition comprises a silicon containing pre-polymer comprising a combination of tetraethoxysilane oxide, methyl tetraethoxysilane oxide, and dimethylethoxysilane, and the catalyst comprises tetramethyl ammonium acetate.

27. The method of claim 1 wherein the composition further comprises a solvent.

28. The method of claim 1 wherein the composition further comprises a solvent in an amount ranging from about 10 to about 95 percent by weight of the composition.

29. The method of claim 1 wherein the composition further comprises a solvent having a boiling point ranging from about 50 to about 250° C.

30. The method of claim 1 wherein the composition further comprises a solvent selected from the group consisting of hydrocarbons, esters, ethers, ketones, alcohols, amides and combinations thereof.

31. The method of claim 30 wherein the solvent is selected from the group consisting of di-n-butyl ether, anisole, acetone, 3-pentanone, 2-heptanone, ethyl acetate, n-propyl acetate, n-butyl acetate, ethyl lactate, ethanol, 2-propanol, dimethyl acetamide, propylene glycol methyl ether acetate, and combinations thereof.

32. The method of claim 1 wherein the composition comprises a silicon containing pre-polymer selected from the group consisting of tetraethoxysilane, a $C_1$ to $C_6$ alkyltriethoxysilane, an aryl-triethoxysilane, a $C_1$ to $C_4$ dialkyltriethoxysilane, a diaryl-diethoxysilane, and combinations thereof; wherein the silicon-based dielectric polymer has a weight ratio of organic groups to SiO groups of about 0.01:1 or more; wherein the catalyst is selected from tin, group consisting of tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof; wherein step (c) is conducted by heating the composition at a temperature of from about 125° C. to about 500° C.; and wherein the silicon-based dielectric film has a field breakdown voltage of about 2.5 MV/cm or more.

33. The method of claim 1 further comprising the step of curing the film.

34. The method of claim 1 further comprising the step of curing the film by subjecting the film to an ultraviolet radiation exposure treatment, a heating treatment or combinations of an ultraviolet radiation exposure treatment and a heating treatment.

35. The method of claim 1 further comprising the step of curing the film by subjecting the film to an ultraviolet radiation exposure treatment, a heating treatment or combinations of an ultraviolet radiation exposure treatment and a heating treatment; wherein heating is done at a temperature of about 125° C. to about 500° C. for from about 10 minutes to about 30 minutes; and ultraviolet radiation exposure treatment is done at wavelengths in the range of about 100 nm to about 400 nm, at an exposure dose is from about 100 mJ/cm2 to about 200 mJ/cm2.

36. The method of claim 1 further comprising the step of curing the film by subjecting the film to an ultraviolet radiation exposure treatment, a heating treatment or combinations of an ultraviolet radiation exposure treatment and a heating treatment; wherein heating is done at a temperature of from about 125° C. to about 250° C. for from about 10 minutes to about 30 minutes; and ultraviolet radiation exposure treatment is done at wavelengths in the range of about 172 nm to about 250 nm, at an exposure dose is from about 100 mJ/cm$^2$ to about 200 mJ/cm$^2$.

37. A method of producing a silicon-based dielectric film comprising:
  (a) preparing a composition comprising at least one silicon containing pre-polymer having at least one organic group, a catalyst, and optionally water and wherein the composition is absent of any porogen;
  (b) coating a substrate with the composition to form a film on the substrate,
  (c) crosslinking the composition to produce a substantially void-free silicon-based dielectric film containing a silicon-based dielectric polymer, having a transparency to light in the range of about 400 nm to about 800 nm of about 95% or more; and
  (d) curing the silicon-based dielectric film.

38. A device produced by the method of claim 1.

39. A flat panel display comprising the device of claim 38.

* * * * *